United States Patent [19]

Naden

[11] 3,997,877
[45] Dec. 14, 1976

[54] TIMING CONTROL MEANS FOR A MAGNETIC DOMAIN MEMORY

[75] Inventor: Rex Alan Naden, Richardson, Tex.

[73] Assignee: Texas Instruments Incorporated, Dallas, Tex.

[22] Filed: Mar. 3, 1975

[21] Appl. No.: 554,892

[52] U.S. Cl. .................. 340/172.5; 340/174 TF
[51] Int. Cl.² ................................. G11C 11/02
[58] Field of Search ............... 340/172.5, 174 TF

[56] References Cited
UNITED STATES PATENTS

| | | | |
|---|---|---|---|
| 3,743,788 | 7/1973 | Krupp | 179/15 AQ |
| 3,798,607 | 3/1974 | Minnick et al. | 340/172.5 |

*Primary Examiner*—Gareth D. Shaw
*Assistant Examiner*—C. T. Bartz
*Attorney, Agent, or Firm*—Harold Levine; James T. Comfort; William E. Hiller

[57] ABSTRACT

A non-volatile digital memory is utilized to generate digital pulses for controlling memory operations of a magnetic domain memory system. Each word stored in the memory contains data corresponding to the desired control signals. The digital memory synchronizes the control pulses with the in-plane rotating magnetic field. During each rotation of the magnetic field, a binary counter sequentially addresses the words stored in the digital memory such that the outputs from the digital memory correspond to the desired control signals.

11 Claims, 6 Drawing Figures

TIMING CONTROL MEANS FOR A MAGNETIC DOMAIN MEMORY

BACKGROUND OF THE INVENTION

1. Field of the Invention

The present invention relates to magnetic bubble domain memory systems in general and more particularly to control means for generating synchronized control signals for carrying out memory and logic functions.

2. Description of the Prior Art

In the field of electronic computers and other data processing devices, the performance of such systems is largely limited by the speed, capacity and reliability of the memory system. Various types of memory systems are known and have been used in the art, such as disc files, magnetic tapes, ferrite cores and etc. Recently significant interest has been directed toward a different type of memory wherein data is stored in the form of magnetic "bubbles" moving in thin films of magnetic material. The bubbles are actually cylindrical magnetic domains whose polarization is opposite to that of the thin magnetic film in which they are embedded. The bubbles are stable over a considerable range of conditions and can be moved from one point to another at high velocity. Interest in these devices in large part is based on the high packing density that can be achieved and the ability of the cylindrical domain to be independent of the boundary of the magnetic material in the plane in which it is formed and hence capable of being moved anywhere in the plane of the magnetic material to effect various memory and logic functions. Such devices are described in an article by Andrew H. Bobeck and H.E.D. Scoville entitled "Magnetic Bubbles", Scientific American, June 1971, Vol. 224, pp. 88–90. This article describes several structures for manipulating and controlling transmission of magnetic bubbles along discrete paths and includes an explanation of one form of a magnetic bubble domain memory.

A magnetic domain can be manipulated by programming currents through a pattern of conductors positioned adjacent the magnetic material or by varying the magnetic field surrounding the magnetic material. As an example, the magnetic domains or bubbles may be formed in thin platelets having uniaxial anisotrophy with the easy magnetic axis perpendicular to the plate comprising such material as rare earth orthoferrites, rare earth aluminum and gallium substituted iron garnets or rare earth cobalt. Since the magnetic domains can be propagated, erased, replicated and manipulated to form logic operations and their presence and absence detected, the magnetic domains may be utilized to perform many of the on/off or digital functions vital to computer operation.

Magnetic bubble domain memory systems offer significant advantages since logic, memory, counting, and switching can all be performed within a single layer of solid magnetic material. This is in contrast to conventional memory systems in which information must move from one device to another through interconnecting conductors and high gain amplifiers.

Many organizations of magnetic domain memories have been disclosed. As an example, U.S. Pat. No. 3,618,054 discloses a major-minor loop memory organization. Typically, the major loop is closed and is established by an arrangement of T-bar or chevron Permalloy circuits on an orthoferrite or garnet crystal platelet. The bubble domains are moved around the loop by a magnetic field which rotates in the plane of the magnetic material. The major loop is generally elongated such as to allow a number of minor loops to be aligned along side. Two-way transfer gates permit the transfer of magnetic domains from the minor loop to the major loop and from the major loop to the minor loops. Data information stored in the minor loops is first circulated until the desired word (comprised of one bit from each loop) reaches the transfer points. On command of a transfer signal, the information is transferred to a major loop whereupon it can be simply read out or erased and overwritten. The data is then further advanced along the major loop in response to the rotating magnetic field and transferred back into the minor loops.

The major-minor loop organization permits a synchronized pattern of domains in the corresponding minor loops to represent a binary word. The propagation of domains in the loops is synchronous so as to permit parallel transfer of a selected word into the major loop by the simple expedient of keeping track of the number of rotations of the in-plane magnetic field to determine the proper instant of transfer.

In order to carry out the memory functions, such as logic operations, reading, writing and etc., it is necessary to drive electrical current through appropriate leads on the magnetic bubble domain chip at precisely timed intervals relative to the in-plane rotating field present at the chip's surface. The electrical currents must be applied at precise times in order to maintain synchronous operations. These currents are effective to control the magnetic bubble domains in such a way so as to allow the user to write data into the chip at desired locations and also to read data from desired locations.

Typically, the control signals for synchronizing memory operations for a magnetic bubble domain memory system are generated by one-shot multivibrators which depend on RC discharge circuits in order to produce pulses at desired intervals during each rotation of the in-plane rotating magnetic fields. Various problems, however, have been encountered in utilizing one-shot multivibrators for generating these control signals. First, timing control circuits comprising one-shot multivibrators are relatively expensive. One contributing factor to the relatively large expense is the fact that a large number of parts are required in order to provide the required number of control signals. Not only are the parts themselves expensive but since a large number of parts is required, the assembly and test costs associated therewith are also substantial. Secondly, the large number of discrete parts requires a substantial amount of space and makes the overall system larger than would be desired. Thirdly, the reliability is reduced as a result of the large number of parts and assembly and test operations required. Fourthly, it is difficult to get reproducibility of the control signals over different operating conditions because the component values vary with temperature fluctuations. Further it is difficult to select resistors and capacitors for the RC timing circuits that are exactly of the same value. As a result, there will be some variation between the different control signals caused by manufacturing tolerances in component values.

Accordingly, it is an object of the present invention to provide improved timing control for a magnetic bubble domain memory system.

A further object of the invention is to provide means for generating control signals for magnetic bubble domain memory systems which is more compact, less expensive and more reliable than conventional one-shot multivibrator RC discharge circuits.

An additional object of the present invention is to utilize a non-volatile digital memory for generating control signals for a magnetic bubble domain memory system.

SUMMARY OF THE INVENTION

The present invention utilizes a non-volatile digital memory in order to generate the control signals required for synchronizing memory operations of a magnetic bubble domain memory system.

Thus in accordance with one embodiment of the present invention, a digital data memory is utilized in order to store digital data corresponding to the desired control signals. The digital memory has a number of addressable memory locations or words. Each word stored by the digital memory contains a number of bits corresponding to the number of control signals required for the magnetic domain memory system. Each bit is coupled to an output line and stores a binary 1 or a binary 0 corresponding to the presence or absence of a control pulse at a preselected time interval during each rotation of the in-plane rotating magnetic field. A binary counter is connected to the digital memory; the binary counter counts through the addresses of the digital memory during each cycle of the magnetic domain memory system (i.e., during each revolution of the rotating magnetic field). Thus, a signal is generated on each output line of the digital memory responsive to the counter sequentially addressing the words stored therein. The signal includes a voltage pulse at time intervals corresponding to selection of memory words wherein the "bit" associated with the output line had stored therein a binary 1.

In a preferred embodiment of the invention, a read-only-memory is used to store the digital data corresponding to the desired control signals and a latch is used to couple the read-only-memory outputs to the magnetic bubble domain chip in order to eliminate any noise associated with addressing the digital memory.

Other objects, advantages and features of the invention in addition to those described above will be apparent from the following detailed description of illustrative embodiments taken in conjunction with the drawings.

DESCRIPTION OF THE INVENTION

Figure 1:
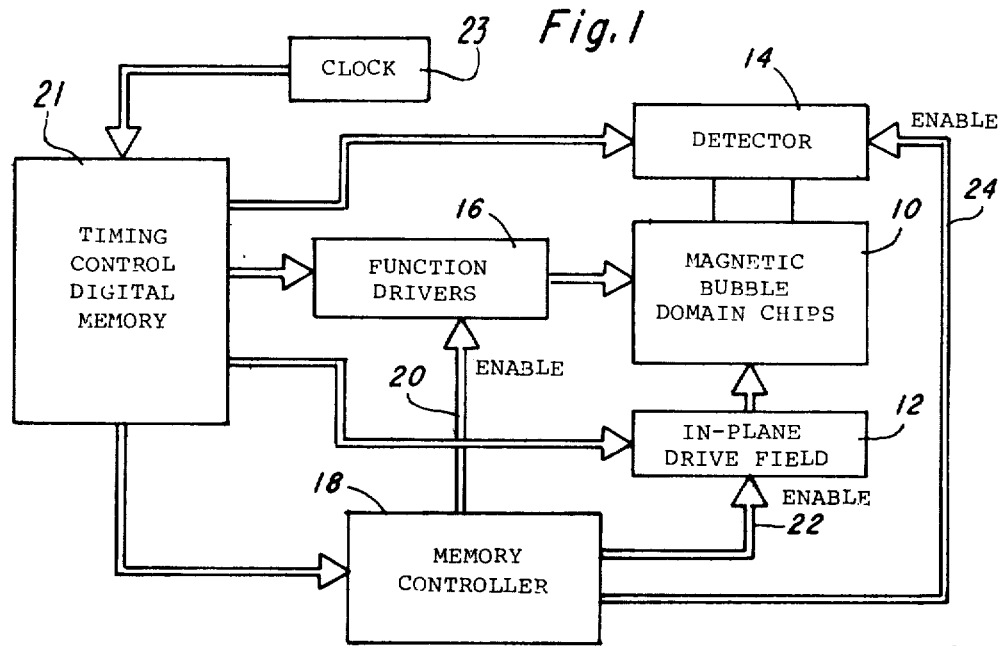
FIG. 1 is a block diagram of a magnetic bubble domain memory system utilizing a digital memory for generating the timing control signals required for synchronizing magnetic bubble domain memory operations.

With reference now to FIG. 1, there is illustrated in block diagram format a magnetic bubble domain memory system utilizing a digital memory for generating control signals for synchronizing memory operations. Magnetic bubble domain memory chips 10 are of conventional type comprising a magnetic wafer having a soft magnetic overlay which guides the magnetic bubble domains along the various paths in response to a rotating magnetic field. The basic structural details of such a magnetic bubble domain structure are well known to those skilled in the art and consequently have not been illustrated in detail. A source for generating the in-plane rotating magnetic field is shown at 12. Means for detecting the presence or absence of a magnetic domain are shown at 14. Drive circuitry for generating the currents necessary to carry out operations required for memory functions, such as generate, transfer, annihilate, or replicate and etc., are shown in block diagram at 16. A memory controller is shown at 18 for providing enable signals 20, 22 and 24 to the function drivers 16, the in-plane drive field 12 and the detection circuit 14, respectively. The timing control means are illustrated generally at 21 and in accordance with the present invention includes a digital memory. The timing control means receives an input from the clock 23.

In operation the timing control 21 provides control signals to the function drivers 16, the detector 14, the in-plane drive field source 12, and the memory controller 18. Thus, all of the memory operations are controlled and synchronized by the timing control 21. Actual memory operations cannot be effected until an enable signal is received from the memory controller. Operation of the timing control 21 for synchronizing operations of the magnetic domain memory system can better be understood with reference to FIGS. 2, 3 and 4.

Figure 2:
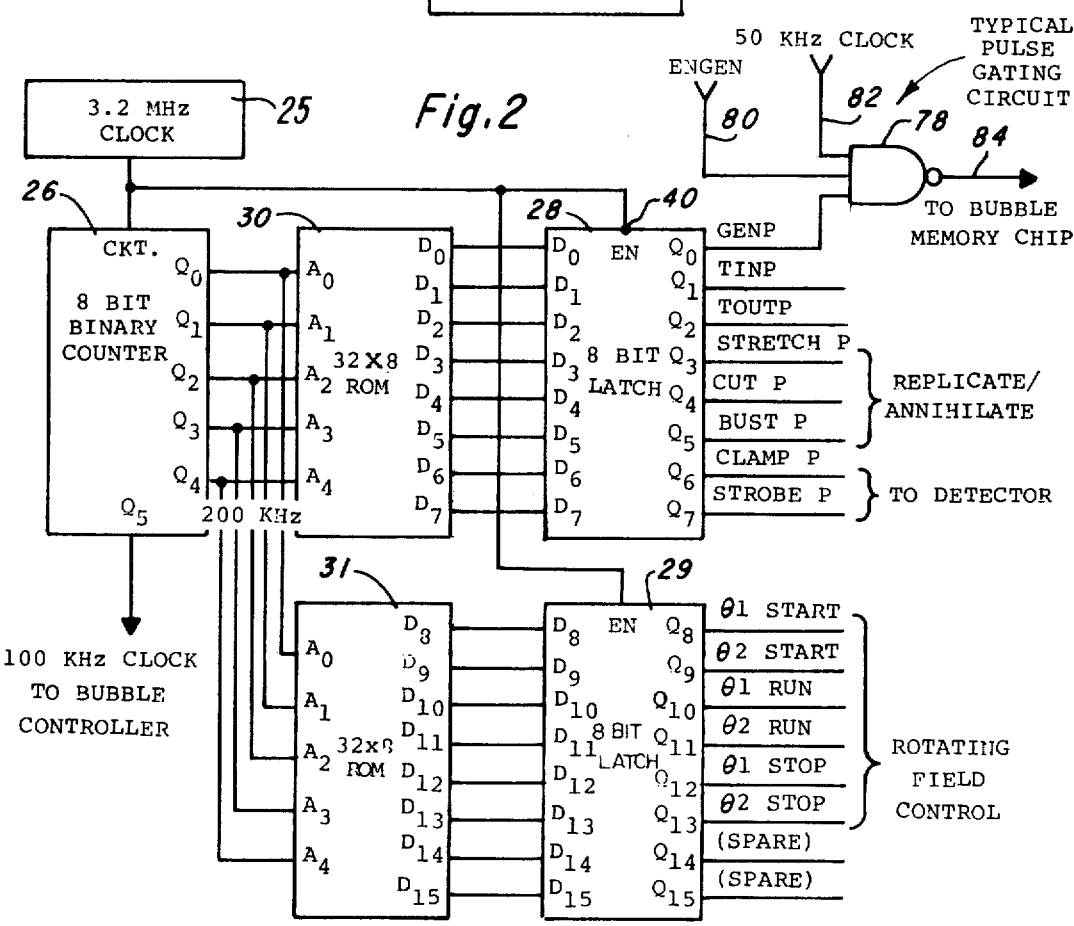
FIG. 2 schematically illustrates an illustrative specific embodiment of means for generating timing control signals in accordance with the invention.

FIG. 2 illustrates schematically a configuration in accordance with a preferred embodiment of the invention for generating the required control signals. In this embodiment a 3.2 MHz clock 25 of conventional design provides an input to an eight bit binary-counter 26. A suitable binary counter is available from Texas Instruments Incorporated, part number SN 74-393. The 3.2 MHz. clock is also applied to the enable input of two eight bit latches 28 and 29 for reasons which will be explained hereinafter.

A suitable latch is available from Texas Instruments Incorporated, part number SN 74-273. The embodiment of FIG. 2 illustrates a magnetic bubble domain memory configuration wherein a frequency of 100 KHz has been chosen for the in-plane rotating magnetic field. This operating frequency is typical in present day magnetic domain memory devices but is in no way critical to operation of the present invention and may be increased as device speed increases. The binary counter 26 has an output $Q_5$ which provides the 100 KHz clock to the memory controller 18 (FIG. 1) which in turn provides synchronous enable signals for each function.

The binary counter 26 has five outputs $Q_0$, $Q_1$, $Q_2$, $Q_3$ and $Q_4$ which are simultaneously applied to the inputs $A_0$, $A_1$, $A_2$, $A_3$ and $A_4$ of two 32 × 8 read-only-memorys 30 and 31. A suitable mask-programmable read-onlymemory is Texas Instruments Part No. SN 74-88A. Also, it may be desirable to use an electrically programmable read-only-memory, such as Texas Instruments Incorporated part No. SN 74-188 as this will facilitate easily changing from one set of control signal timings to a different set of control signal timings. Upon determination of the desired control signal timings, however, a read-only-memory would likely be preferred due to cost savings as compared to a programmable read-only-memory.

The binary counter 26 repetitively counts through the 32 addresses of the read-only-memory 30, each complete cycle through the 32 addresses requiring 10 microseconds. It will be noted that the period of 10 microseconds corresponds to the magnetic bubble domain frequency of 100 KHz. That is, each cycle of the magnetic domain memory system at an operating frequency of 100 KHz corresponds to 10 microseconds. Also it will be noted that a new read-only-memory address is selected once every 312 nanoseconds. Stated differently, the data stored in a given memory location of the read-only-memorys 30 and 31 will be present on the output lines of the memorys 30 and 31 for a period of only 312 nanoseconds.

The read-only-memorys have 16 outputs, $D_0 - D_{15}$ which are applied to two eight bit latches 28 and 29. The latches are preferably used so that noise associated with selecting the address of the read-only-memorys 30 and 31 can be eliminated from the control signals. The control signals are present at the out-put of the eight bit latches 28 and 29 at terminals $Q_0 - Q_{15}$. The 16 total outputs illustrated are effective to carry out the data operations required for the magnetic domain memory functions.

Figure 3:
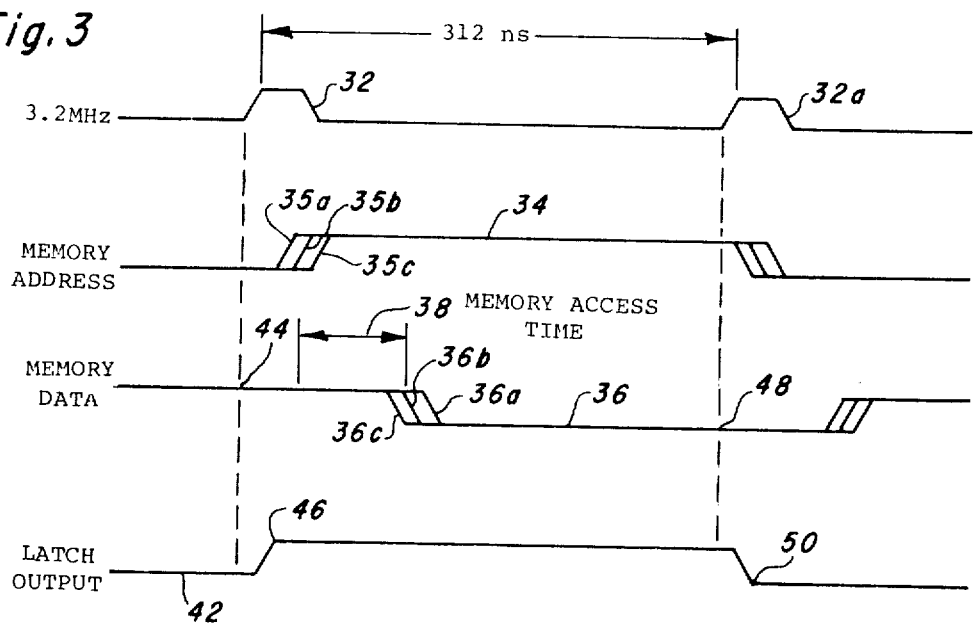
FIG. 3 illustrates typical signal waveforms associated with the circuit of FIG. 2.

With reference to FIG. 3, typical waveforms of the timing control illustrated in FIG. 2 are shown. The 3.2 MHz clock has a pulse 32 every 12 nanoseconds. Responsive to each pulse 32, the binary counter 26 provides an output at terminals $Q_0 - Q_4$ corresponding to one of the memory addresses of the read-only-memorys 30 and 31. Responsive to the signals on terminals $Q_0 - Q_4$ of counter 26, one of the 32 memory words of the read-only memorys 30 and 31 is selected by memory address signals 34. As schmetically illustrated by leading edge portions 35a, 35b, and 35c, the exact instant when the memory address signal 34 will be available can vary over a small increment. Similarly the memory data waveform 36 shows that some delay is experienced after application of the memory address signal 34 before the data 36 is outputted from the outputs $D_0 - D_{15}$ of the read-only-memorys 30 and 31. As with the memory address signal 34, the instant when the memory data 36 will be available at the output lines can vary over a small increment as shown by the portions of the waveforms 36a, 36b and 36c. As a result, there is a memory access time 38 associated with selecting a memory word and reading out the data therefrom.

In order to eliminate the uncertainty of exactly when output data 36 will be available from the read-only-memorys 30 and 31, two latches 28 and 29 are utilized to receive the read-only-memory outputs, $D_0 - D_{15}$. The latches have an enable terminal 40 connected to the 3.2 MHz clock 25. A typical waveform of a latch output signal such as $Q_0$ (GENP) is shown in FIG. 3. For the example illustrated, it is assumed that the data stored in the bit corresponding to the output $D_0$ of read-only-memory 30 at the preceeding address was a logic 0 so that the latch output at interval 42 is 0 or a low voltage.

In operation, the latches 28 and 29 receive at the enable input 40 clock pulse 32 from the 3.2 MHz clock 25. As previously described the clock pulse 32 is applied to the binary counter 26 so that the counter will provide as an output to the read-only-memorys 30 and 31, the address of the next memory word to be selected. Upon receipt of the clock pulse 32, the latches 28 and 29 sample at 44 the level of the output data 36 from the read-only-memorys. In the illustrated example the output data 36 at time 44 is a logic 1. The latch output changes then to a logic 1 level at time 46. The latches again sample the output of the read-only-memorys upon receipt of clock pulse 32a. The data output level at time 48 is a logic 0 so the latch output returns to a low voltage level at time 50. The latch response time is very fast and since it samples the logic level of the data at the outputs of the read-only-memorys only during intervals when the output data 36 is valid, i.e., it does not sample data during the memory access time, any noise or inconsistency associated with addressing the memories or generating memory outputs is eliminated by the latches.

Figure 4:
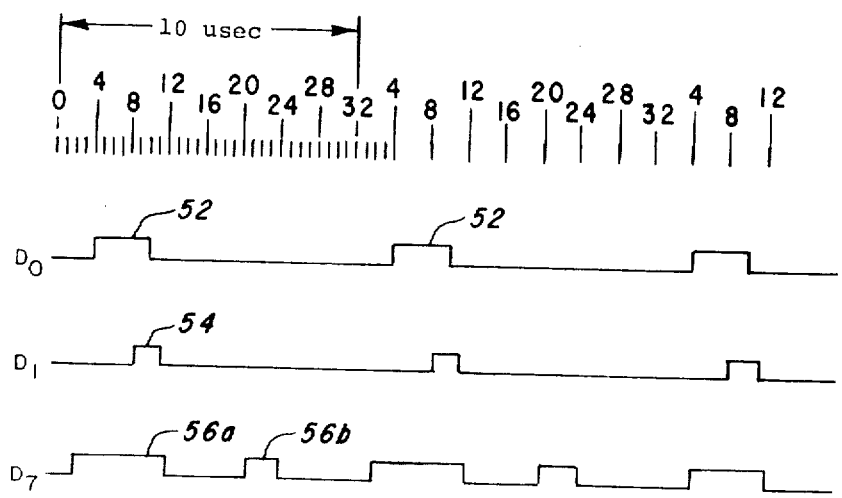
FIG. 4 illustrates typical control signals generated by the timing control means of the present invention.

With reference to FIG. 4, waveforms of three representative output pulses from the read-only-memories 30 and 31 are shown at $D_0$, $D_1$ and $D_7$. Two complete memory cycles are illustrated. The 3.2 MHz clock is effective to divide the 10 microsecond memory cycle into 32 discrete portions; i.e., the clock provides a pulse every 312 nanoseconds (32 pulses for each 10 microsecond cycle) as previously described. The binary counter 26 sequentially selects the 32 addresses of the read-only-memories during each 10 microsecond magnetic domain memory cycle. Thus the outputs $D_0 - D_{15}$ of the read-only-memories are repeated every 10 microseconds. The control signal $D_0$ is illustrated as having 1 pulse 52 of 6 units duration (each unit being 312 nanoseconds) during each 10 microsecond cycle, beginning with the 5th 312 nanosecond increment (corresponding to the 5th memory address of the read-only-memory) and terminating at the end of the 10th 312 nanosecond increment. Control signal $D_1$ is illustrated as having a control pulse 54 commencing at the initiation of the 9th nanosecond increment and concluding at the end of the 11th nanosecond increment. Similarly control signal $D_7$ has two separate control pulses 56a and 56b during each 10 microsecond memory cycle. Contents of bits of a read-only-memory suitable for generating the control pulses $D_0 - D_1$ and $D_7$ (corresponding to bits $Q_0$, $Q_1$ and $Q_7$ of a memory word) are illustrated in the table below. Contents of bits corresponding to outputs $D_2 - D_6$ and $D_8 - D_{15}$ are not shown but are also programmed with 0's or 1's to provide desired control signals.

| MEMORY ADDRESS | READ-ONLY-MEMORY CONTENTS | | |
|---|---|---|---|
| | $D_0$ | $D_1$ | $D_7$ |
| 0 | 0 | 0 | 0 |
| 1 | 0 | 0 | 0 |
| 2 | 0 | 0 | 1 |
| 3 | 0 | 0 | 1 |
| 4 | 1 | 0 | 1 |
| 5 | 1 | 0 | 1 |
| 6 | 1 | 0 | 1 |
| 7 | 1 | 0 | 1 |
| 8 | 1 | 1 | 1 |
| 9 | 1 | 1 | 1 |
| 10 | 0 | 1 | 1 |
| 11 | 0 | 0 | 1 |
| 12 | 0 | 0 | 0 |
| 13 | 0 | 0 | 0 |
| 14 | 0 | 0 | 0 |

-continued

| READ-ONLY-MEMORY CONTENTS | | | |
|---|---|---|---|
| MEMORY ADDRESS | $D_0$ | $D_1$ | $D_7$ |
| 15 | 0 | 0 | 0 |
| 16 | 0 | 0 | 0 |
| 17 | 0 | 0 | 0 |
| 18 | 0 | 0 | 0 |
| 19 | 0 | 0 | 0 |
| 20 | 0 | 0 | 1 |
| 21 | 0 | 0 | 1 |
| 22 | 0 | 0 | 1 |
| 23 | 0 | 0 | 1 |
| 24 | 0 | 0 | 0 |
| 25 | 0 | 0 | 0 |
| 26 | 0 | 0 | 0 |
| 27 | 0 | 0 | 0 |
| 28 | 0 | 0 | 0 |
| 29 | 0 | 0 | 0 |
| 30 | 0 | 0 | 0 |
| 31 | 0 | 0 | 0 |

It will be noted that a read only memory provides the capability of providing multiple pulses such as 56a and 56b during each 10 microsecond memory cycle. Using conventional one-shot multivibrator RC discharge circuits for generating control signals, a separate one-shot multivibrator would be required for each pulse.

Figure 5:
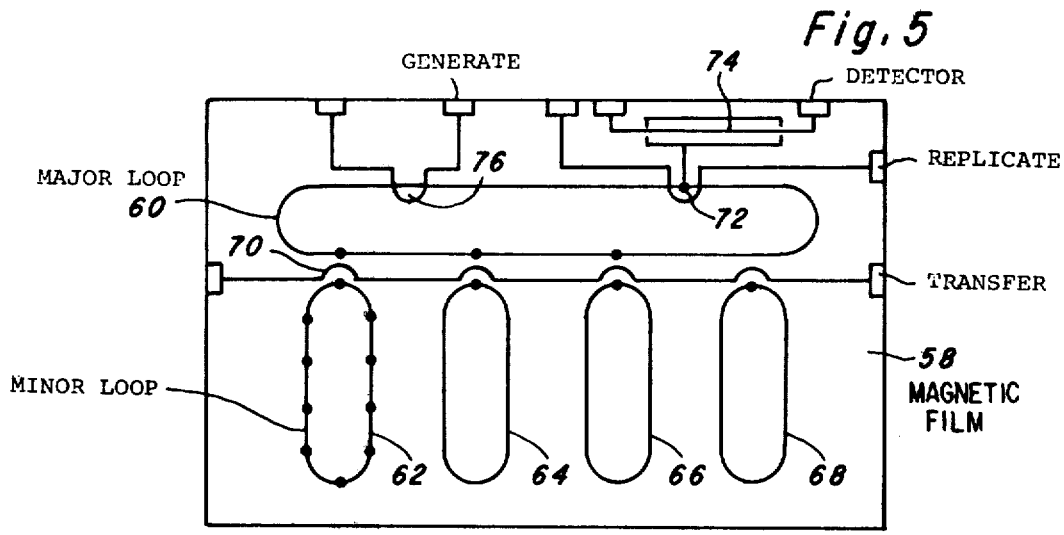
FIG. 5 is a plan view of a major-minor loop magnetic bubble domain memory chip organization which can be controlled by the control signals generated in accordance with the present invention.

With reference to FIG. 5 there is illustrated a plan view of a major-minor loop magnetic bubble domain memory configuration, the memory operations of which can be controlled by the timing control circuitry of the present invention. The magnetic domains are formed within a suitable material 58 such as an expitaxial magnetic garnet film on a non-magnetic garnet substrate. The conditions for establishing magnetic domains in such material are well known in the art. Patterns of magnetically soft overlay material (not shown) such as Permalloy T-bar and chevron-shaped segments are commonly employed to determine the loop patterns. One long loop identified as major loop 60 closes on itself so that circulating magnetic domains established in the loop circulate indefinitely (responsive to a rotating magnetic field in the plane of material 58) provided they are not transferred out. Aligned opposite the major loop 60 are a series of identical minor loops 62, 64 66 and 68. One portion (that nearest to major loop 60) of each minor loop acts as part of a two way port or transfer gate 70 with the major loop. A transfer pulse transfers one magnetic domain or the absence of the magnetic domain from each of the minor loops to the major loop simultaneously. Once in the major loop, the magnetic domains are propagated by an in-plane magnetic field, each rotation signifying, for example, four steps in the T-bar advancement sequence. The magnetic domain sequence passing point 72 on the major loop is replicated and read by the detector 74. If the write operation is desired the magnetic domain is annihilated at point 72 and a generator at point 76 may write new data as desired into the loop. In accordance with the present invention, a digital memory is used to synchronously provide control signals for generating, detecting, transferring, replicating, annihilating, and otherwise manipulating the magnetic domains to provide memory functions. Control for the rotating magnetic field is provided also. These signals are produced at the output of the latches 28 and 29, in the preferred embodiment.

In a typical magnetic domain memory system wherein the frequency of the in-plane rotating magnetic field in 100 KHz, the magnetic domains in the minor loops will be spaced apart by a distance corresponding to a propagation time of 10 microseconds. The magnetic domains in the major loop are typically spaced apart by a distance corresponding to 20 microseconds to permit room for location of the minor loops on the chip. Accordingly, as illustrated in FIG. 2 the output $Q_0$ (GENP) from the latch 28, which signal occurs once every 10 microseconds, is applied as an input to the logic gate 78. A second input to the logic gate 78 occurs at 80 and is the enable generate signal from the memory controller 18. A 50 KHz clock signal is applied as a third input to the logic gate 78 at 82. The output 84 of the logic gate 78 thus will permit bubble generation once only every 20 microseconds. It will be understood, of course, that the frequency of operation and magnetic domain density is given by way of example only and is no way limiting to the invention.

In the example above illustrated, each 10 microsecond memory cycle is broken down into 32 discrete segments of 312 nanosecond duration (corresponding respectively to a memory location in the read-only-memory). Thus the duration, initiation, or termination of a pulse can be controlled to within 312 nanoseconds. If greater resolution or control over the pulse is required, a 64 × 8 read-only-memory could be utilized with a 6.4 MHz clock to permit control over the pulse to an interval of 156 nanoseconds.

Figure 6:
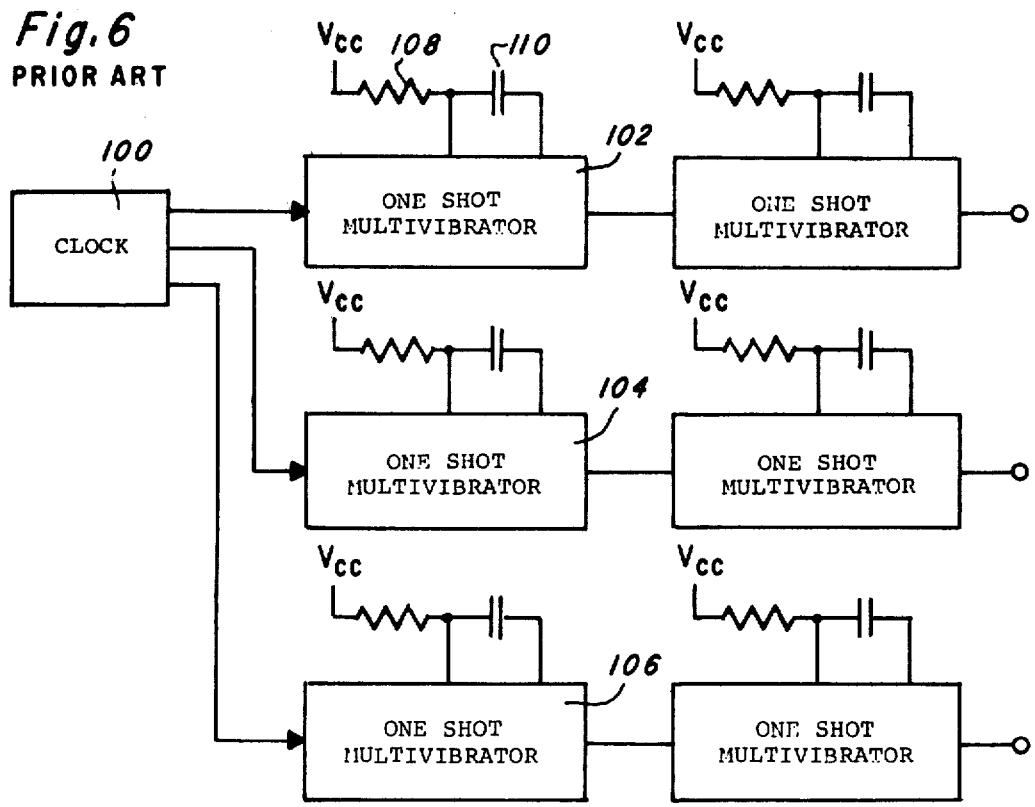
FIG. 6 is a schematic illustration of prior art circuitry for generating control signals for magnetic bubble domain memory systems.

With reference now to FIG. 6, a prior art circuit for generating control signals for a magnetic bubble domain memory system is illustrated. In this example a clock 100 provides clock signals to a one-shot multivibrator such as marketed by Texas Instruments Incorporated (product number SN 74–121). Again using a representative memory cycle of 10 microseconds duration, the output of each one-shot multivibrator would be a single pulse of duration determined by the resistor-capacitor combination, 108, 110. For a typical memory system at least fourteen control signals are required. For such a situation, 28 separate one-shot multivibrators such as 102 would be required and 28 separate resistors and 28 separate capacitors such as 108 and 110 would be required, making a total part count of 84. This is contrasted to the timing means of the present invention where only five logic networks are required. Additionally, the one-shot multivibrators must be set to correspond to the frequency of memory operation (i.e., typically 100 KHz). If a different frequency of operation is desired, the multivibrators will have to be completely re-adjusted. This is not the case with the present invention wherein synchronous operation is maintained even if the clock frequency is changed. Accordingly, it will be seen that the present invention provides numerous advantages over the prior art technique for generating control signals for magnetic bubble domain memory systems.

While the present invention has been particularly shown and described with reference to preferred embodiments, it will be understood by those skilled in the art that other changes can be made without departing from the spirit and scope of the invention. In particular, the present invention has been specifically described with respect to 32 × 8 read-only-memory. It will be apparent to those skilled in the art that any nonvolatile memory capable of storing digital data, and of providing a suitable number of output signals, can be used.

Further changes in design fall within the scope of this invention. First, the digital control memory need not be operated to divide the bubble timing cycle into 32 equal increments. Instead, the cycle can be divided into less than 32 equal increments by resetting the memory address counter via a synchronization bit in a spare data channel (e.g., $Q_{14}$ and $Q_{15}$ in FIG. 2). Second, the digital control memory can be extended in capacity lengthwise (e.g., use of 64 × 8 devices instead of 32 × 8 devices) to program additional rotating field control sequences. Specifically, typical field driver circuitry requires three different control patterns; start, run, and stop. These patterns can be stored lengthwise in the control memory thereby eliminating separate control circuitry otherwise necessary for sequencing through the start, run and stop states.

What is claimed is:

1. A magnetic bubble domain memory system comprising:
    a body of magnetic material capable of supporting magnetic bubble domains;
    means coupled to said body for generating and controllably positioning magnetic bubble domains in said magnetic material in step fashion;
    means coupled to said body for detecting magnetic bubble domains in said magnetic material; and
    timing control means coupled to said body to regulate said generating and controllably positioning means and said detector means via timing control information for controlling the operational functioning of said system, said timing control means including a timing source comprising a digital data memory having a plurality of output lines operationally connected into said system for generating respective time control signals through said plurality of output lines in providing the timing control information enabling operation of said magnetic bubble domain memory system.

2. A magnetic bubble domain memory system as set forth in claim 1 wherein said digital data memory comprises a read-only-memory.

3. A magnetic bubble domain memory system as set forth in claim 1 wherein said timing source further includes a binary counter coupled to said memory, each output of said counter corresponding to the address of a memory location, said counter operable to sequentially select a predetermined number of memory locations whereby the digital data outputted on each output line responsive to said counter sequentially selecting said predetermined number of memory locations corresponds to a time control signal.

4. A magnetic bubble domain memory system as set forth in claim 3, wherein said timing source further includes a clock connected to the input of said counter, and latch means connected to said output lines and to said clock, said latch means being effective to remove from said time control signals any noise associated with addressing said memory.

5. A magnetic bubble domain memory system comprising:
    a planar body of magnetic material capable of supporting magnetic bubble domains;
    positioning means coupled to said body for controllably positioning said magnetic bubble domains in said magnetic material responsive to the orientation of a magnetic field in the plane of said body of magnetic material;
    a magnetic field source coupled to said body of magnetic material for generating and rotating said magnetic field in said plane;
    a detection circuit coupled to said body of magnetic material for sensing the presence of a magnetic bubble domain;
    drive means coupled to said body of magnetic material for providing drive currents effective to manipulate magnetic bubble domains to provide memory operations; and
    timing control means coupled to said positioning means, said magnetic field source, said detection circuit, and said drive means for synchronizing memory operation via timing control information during each magnetic bubble domain memory system cycle, said timing control means including a timing source comprising a digital data memory having a plurality of addressable memory locations and a plurality of output lines each, digital memory location including a plurality of bits respectively coupled to an associated output line, said digital memory having stored therein digital data corresponding to time control signals for said magnetic bubble domain memory system, and a binary counter operably coupled to said digital memory for sequentially addressing the memory locations thereof during each magnetic bubble domain memory cycle for generating respective time control signals through said plurality of output lines in providing the timing control information enabling operation of said magnetic bubble domain memory system.

6. A magnetic bubble domain memory system as set forth in claim 5 wherein said timing source further includes a clock connected to the input of said counter, and latch means connected to the output lines of said digital memory and to said clock, said latch means being effective to remove from said time control signals any noise associated with addressing said digital memory.

7. In a magnetic bubble domain memory system, wherein magnetic bubble domains are manipulated within a planar body of magnetic material capable of supporting magnetic bubble domains by a magnetic field, the orientation of which is rotated in the plane of said body of magnetic material, and wherein a plurality of time control signals are required during each revolution of said rotating magnetic field in order to implement the functional operation of the magnetic bubble domain memory system including bubble generation, propagation and detection in accordance with a predeterminable time sequence, the improvement comprising:
    timing control means for providing said plurality of time control signals;
    said timing control means including a digital memory having a plurality of sequentially addressable memory locations and a plurality of output lines, each memory location including a plurality of bits respectively coupled to an associated output line and corresponding to a portion of one of said time control signals; and
    address select means coupled to said digital memory for sequentially selecting respective memory locations thereof, and each time control signal being defined by the digital data present on the associated output line during the period that said address select means sequentially addresses said memory locations.

8. A magnetic bubble domain memory system as set forth in claim 7, wherein said address select means comprises a binary counter.

9. A magnetic bubble domain memory system as set forth in claim 8, wherein said timing control means further includes a clock connected to the input of said counter, and latch means connected to the output lines of said digital memory and to said clock, said latch means being effective to remove from said time control signals any noise associated with addressing said digital memory.

10. Timing control means for a magnetic bubble domain memory system, said timing control means comprising:

digital memory means having a plurality of addressable memory locations and a plurality of output lines, said plurality of memory locations having digital data stored therein corresponding to time control signals for regulating the functional operation of said magnetic bubble domain memory system including bubble generation, propagation and detection in accordance with a predeterminable time sequence, each memory location including a plurality of bits respectively coupled to an associated output line; and address select means coupled to said digital memory means for sequentially addressing the memory locations thereof, and a time control signal being produced on each output line in response to the sequential addressing of said digital memory locations corresponding to a time control signal for said magnetic bubble domain memory system by said address select means.

11. Timing control means as set forth in claim 10 wherein said digital memory means comprises a read-only-memory and said address select means comprises a binary counter.

* * * * *